(12) United States Patent
Yonekura et al.

(10) Patent No.: US 11,462,777 B2
(45) Date of Patent: Oct. 4, 2022

(54) BATTERY PACK INSPECTION METHOD AND INSPECTION DEVICE FOR ANOMALY DETECTION VIA VOLTAGE COMPARISON OVER TIME

(71) Applicant: Envision AESC Japan Ltd., Kanagawa (JP)

(72) Inventors: Shiro Yonekura, Kanagawa (JP); Eriko Kuribayashi, Kanagawa (JP); Nobuhiro Takamoto, Kanagawa (JP)

(73) Assignee: Envision AESC Japan Ltd., Kanagawa (JP)

( * ) Notice: Subject to any disclaimer, the term of this patent is extended or adjusted under 35 U.S.C. 154(b) by 322 days.

(21) Appl. No.: 16/651,057

(22) PCT Filed: Oct. 4, 2017

(86) PCT No.: PCT/JP2017/036115
§ 371 (c)(1),
(2) Date: Mar. 26, 2020

(87) PCT Pub. No.: WO2019/069390
PCT Pub. Date: Apr. 11, 2019

(65) Prior Publication Data
US 2020/0287251 A1    Sep. 10, 2020

(51) Int. Cl.
*H02J 7/00*    (2006.01)
*G01R 31/396*    (2019.01)
(Continued)

(52) U.S. Cl.
CPC ...... *H01M 10/482* (2013.01); *G01R 31/3842* (2019.01); *G01R 31/396* (2019.01);
(Continued)

(58) Field of Classification Search
CPC ............ H01M 10/482; G01R 31/3842; G01R 31/396; G01R 31/50; H02J 7/0029; H02J 7/00712
(Continued)

(56) References Cited

U.S. PATENT DOCUMENTS 6,061,639 A * 5/2000 Wistrand ........... G01R 31/3842
340/636.15
6,081,095 A * 6/2000 Tamura ................... B60L 58/22
903/907
(Continued)

FOREIGN PATENT DOCUMENTS

JP    H09-117072 A    5/1997
JP    2002-050410 A    2/2002
(Continued)

OTHER PUBLICATIONS

Japanese Office Action for family Japanese Patent Application #2019546457, filed Jun. 30, 2021 (Year: 2021).*
(Continued)

*Primary Examiner* — John T Trischler
(74) *Attorney, Agent, or Firm* — Morgan, Lewis & Bockius LLP

(57) ABSTRACT

The inspection device includes a charging unit and an inspection unit, and detects the connection anomaly by retrieving a first cell voltage at the early stage of start of the constant-current charging and a second cell voltage at a stage where the charging has progressed to determine deviations from the average value of all the cell groups.

14 Claims, 6 Drawing Sheets

(51) Int. Cl.
*H01M 10/48* (2006.01)
*G01R 31/3842* (2019.01)
*G01R 31/50* (2020.01)

(52) U.S. Cl.
CPC ............ *G01R 31/50* (2020.01); *H02J 7/0029* (2013.01); *H02J 7/00712* (2020.01); *H02J 7/005* (2020.01)

(58) Field of Classification Search
USPC .............................................................. 429/7
See application file for complete search history.

(56) References Cited

U.S. PATENT DOCUMENTS

| | | | | |
|---|---|---|---|---|
| 6,255,826 B1* | 7/2001 | Ohsawa | ................ | H02J 7/0047 324/426 |
| 6,420,852 B1* | 7/2002 | Sato | ..................... | H02J 7/0021 320/134 |
| 6,486,637 B1* | 11/2002 | Nakanishi | ............... | B60L 58/22 320/150 |
| 6,563,318 B2* | 5/2003 | Kawakami | ........... | G01R 31/389 324/426 |
| 7,332,891 B2* | 2/2008 | Sugimoto | ........ | G01R 19/16542 320/116 |
| 7,656,163 B2* | 2/2010 | Yoshida | ............. | G01R 31/3648 320/132 |
| 7,719,134 B2* | 5/2010 | Hashimoto | ........... | H02J 7/0029 361/86 |
| 8,285,501 B2* | 10/2012 | Kinoshita | ........... | H01M 10/425 702/63 |
| 9,246,337 B2* | 1/2016 | Iwasawa | ............... | H02J 7/0019 |
| 9,525,289 B2* | 12/2016 | Yoshida | ................ | H02J 7/0091 |
| 9,761,915 B2* | 9/2017 | Mizuta | ................. | H01M 10/48 |
| 9,812,732 B2* | 11/2017 | Jiang | ................... | H01M 10/441 |
| 9,813,011 B2* | 11/2017 | Despesse | ......... | H01L 31/02021 |
| 9,912,017 B1* | 3/2018 | Kuo | ....................... | H02J 7/0021 |
| 10,008,862 B2* | 6/2018 | Takizawa | ............ | H01M 10/482 |
| 10,079,409 B2* | 9/2018 | Kawashima | ......... | H01M 10/44 |
| 10,901,046 B2* | 1/2021 | Kishi | ..................... | G01R 31/36 |
| 11,043,821 B2* | 6/2021 | Nishikawa | ................ | H02J 7/02 |
| 2002/0070707 A1* | 6/2002 | Sato | ........................ | H02J 7/005 320/134 |
| 2002/0109506 A1 | 8/2002 | Kawakami et al. | | |
| 2004/0001996 A1 | 1/2004 | Sugimoto | | |
| 2008/0048617 A1* | 2/2008 | Yoshida | ........... | G01R 19/16542 320/132 |
| 2008/0309163 A1* | 12/2008 | Hashimoto | ......... | H02J 7/00308 361/86 |
| 2009/0130538 A1* | 5/2009 | Kaita | ................... | G01R 31/374 429/61 |
| 2010/0211341 A1* | 8/2010 | Kinoshita | ........... | H01M 10/482 702/63 |
| 2011/0169450 A1* | 7/2011 | Hudnall | ................ | H02J 7/0019 320/114 |
| 2012/0176095 A1* | 7/2012 | Okuda | ................ | H02J 7/00718 320/134 |
| 2013/0015875 A1* | 1/2013 | Kumar | .................... | H02S 50/10 324/761.01 |
| 2013/0088201 A1* | 4/2013 | Iwasawa | ................ | H02J 7/0016 320/118 |
| 2013/0149572 A1* | 6/2013 | Matsuo | ................ | H01M 50/572 429/61 |
| 2013/0187466 A1* | 7/2013 | Sakai | .................... | H02J 7/0021 307/52 |
| 2014/0111026 A1* | 4/2014 | Despesse | .......... | H01L 31/02021 307/115 |
| 2014/0197794 A1* | 7/2014 | Gu | ........................... | H02J 7/00 320/112 |
| 2014/0285208 A1* | 9/2014 | Mizuta | ................ | H01M 50/124 324/433 |
| 2014/0327445 A1* | 11/2014 | Dewa | .................... | G01R 31/385 324/437 |
| 2015/0035495 A1* | 2/2015 | Yoshida | ................ | H02J 7/0014 320/134 |
| 2015/0050527 A1* | 2/2015 | Jiang | ..................... | H01M 10/06 429/9 |
| 2016/0033581 A1* | 2/2016 | Sunaga | ............... | H01M 10/482 324/434 |
| 2016/0049813 A1* | 2/2016 | Takizawa | ............ | H01M 10/482 320/112 |
| 2016/0169978 A1* | 6/2016 | Fukuhara | .............. | H02J 7/0047 324/434 |
| 2016/0172718 A1* | 6/2016 | Kawashima | ........ | H01M 10/446 29/623.1 |
| 2016/0226263 A1* | 8/2016 | Seo | ........................ | H01M 50/20 |
| 2018/0043789 A1* | 2/2018 | Goetz | .................... | B60L 50/64 |
| 2018/0278066 A1* | 9/2018 | Kurahashi | ............. | B60L 3/0046 |
| 2019/0131802 A1* | 5/2019 | Robbins | ................ | H02J 7/0016 |
| 2019/0242950 A1* | 8/2019 | Kishi | ................... | H01M 10/482 |
| 2020/0044462 A1* | 2/2020 | Sasaki | ................... | H02J 7/0031 |
| 2020/0161875 A1* | 5/2020 | Nishikawa | ................ | H02J 3/32 |
| 2020/0180466 A1* | 6/2020 | Sarwar | .................... | B60L 58/22 |
| 2021/0005938 A1* | 1/2021 | Hayashi | ..................... | H02J 7/02 |
| 2021/0111568 A1* | 4/2021 | Cho | .................... | H01M 10/425 |
| 2021/0296911 A1* | 9/2021 | Itakura | .................. | B60L 3/0046 |
| 2021/0318386 A1* | 10/2021 | Itakura | ................... | H01M 10/48 |
| 2022/0077514 A1* | 3/2022 | Kim | .................... | G01R 31/3842 |

FOREIGN PATENT DOCUMENTS

| | | |
|---|---|---|
| JP | 2004-031120 A | 1/2004 |
| JP | 2006-337155 A | 12/2006 |
| JP | 2009-216448 A | 9/2009 |

OTHER PUBLICATIONS

International Search Report issued in corresponding International Patent Application No. PCT/JP2017/036115 dated Nov. 7, 2017.

* cited by examiner

BATTERY PACK INSPECTION METHOD AND INSPECTION DEVICE FOR ANOMALY DETECTION VIA VOLTAGE COMPARISON OVER TIME

TECHNICAL FIELD

The present invention relates to an inspection method and inspection device of a battery pack where a plurality of secondary battery single cells is accommodated in a pack case, particularly a battery pack of the type having a relatively high capacity for use as a driving source of an electric vehicle or the like.

BACKGROUND ART

Under circumstances where a battery pack with high capacity and high voltage is required for use in e.g. an electric vehicle, it is often the case that the battery pack includes a plurality of series-connected cell groups each having a plurality of parallel-connected cells, such as lithium-ion batteries, and accommodated in a pack case along with a battery controller for charge/discharge control and voltage monitoring of the cells. In one example of battery pack, a plurality of battery modules, each of which has four cells placed in two-series two-parallel connection and equipped with a positive output terminal, a negative output terminal and an intermediate voltage terminal, is accommodated in a pack case. The output terminals of the battery modules are connected in series via e.g. busbars.

The cells assembled into a battery pack have been tested by various inspection tests during the manufacturing process of the respective cells. Only the normal cells with normal voltage characteristics and the like are used in the battery pack. Even in the state that the cells are assembled into battery modules, various inspection tests are performed. Only the normal battery modules are basically used for the assembling of the battery pack. For this reason, it is not generally necessary to, after the assembling of the battery pack, perform an inspection of whether or not the respective cells are normal.

However, there may occur an anomaly such as poor connection between the battery modules, loosening of the screw-type terminal of the battery module for connection to the busbar, separation of the cell-to-cell terminal weld inside the battery module and the like, during the assembling of the batter pack. It has thus recently been requested to perform a final inspection on the battery back after the completion of the battery pack.

As such an inspection technique, Patent Document 1 discloses a method of inspecting a secondary battery by previously storing basic data on the battery voltage of a normal, undeteriorated secondary battery as measured during charging/discharging at various currents under various temperature conditions, measuring the battery voltage of a secondary battery in actual use, and then, judging the occurrence of an anomaly such as short-circuit or internal resistance increase in the secondary battery upon comparison of the measured voltage value with the basic data.

In the above-disclosed inspection method, however, it is difficult to set a threshold value for anomaly judgment because the characteristics of the battery voltage vary depending on the cell temperatures. Furthermore, the temperatures of the individual cells need to be actually measured with temperature sensors in order to make anomaly judgment in consideration of the temperature conditions. It is not realistic to apply such individual cell temperature measurement to the inspection of a battery pack where a plurality of cells is accommodated in a pack case.

PRIOR ART DOCUMENTS

Patent Document
Patent Document 1: Japanese Laid-Open Patent Publication No. 2002-50410

SUMMARY OF THE INVENTION

In view of the foregoing, the present invention is directed to an inspection method and inspection device for inspecting a battery pack in which a plurality of cell groups, each of which has a plurality of chargeable/dischargeable cells connected in parallel, is connected in series.

In one aspect of the present invention, the battery pack is inspected by:
charging the battery pack at a constant current;
retrieving voltages of the respective cell groups at an early stage of start of the charging as first cell voltages;
retrieving voltages of the respective cell groups at a stage where the charging proceeds to a predetermined level as second cell voltages;
comparing the first cell voltage of each of the cell groups with an average value of the first cell voltages of the cell groups, thereby determining a first deviation value;
comparing the second cell voltage of each of the cell groups with an average value of the second cell voltages of the cell groups, thereby comparing a second deviation value; and
detecting a connection anomaly of each of the cells based on the first and second deviation values.

In the case where one cell group in which a plurality of cells is connected in parallel has an anomaly of parallel connection (such as separation of terminal weld of one cell), the first cell voltage of the one cell group at the early stage of start of the charging is equivalent to those of the other cell groups. With the progress of the charging, however, the voltage of the one cell group increases more rapidly than those of the other cell groups. As a result, the second cell voltage of the one cell group becomes higher than those of the other cell groups.

In the case where one cell group has an anomaly of series connection (such as loosening of screw-type terminal), both of the first cell voltage and the second cell voltage become increased with increase in resistance.

Thus, the parallel connection anomaly and the series connection anomaly are easily detected based on the above two deviation values.

In another aspect of the present invention, a connection anomaly is detected in the same manner as above under constant-current discharging of the batter pack.

DESCRIPTION OF THE EMBODIMENTS

Figure 1:
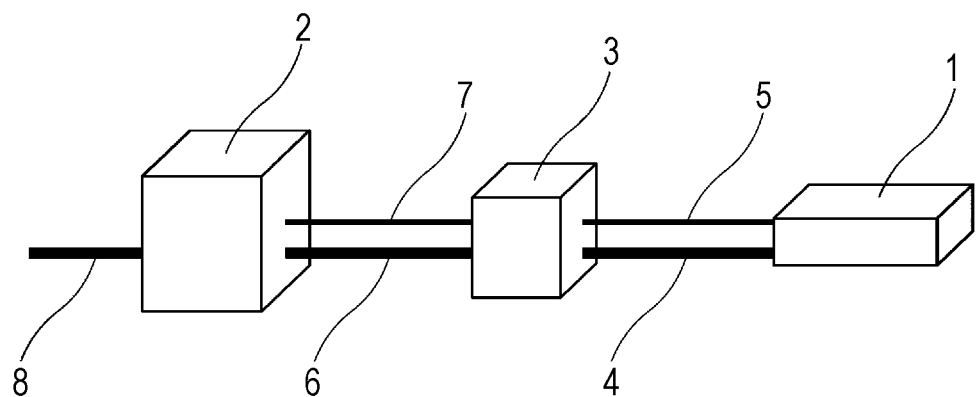
FIG. 1 is a schematic configuration view of an inspection device of a battery pack according to one embodiment of the present invention.

FIG. 1 shows a configuration of a battery pack inspection device according to one embodiment of the present invention. This inspection device is adapted to perform a final inspection on a battery pack 1 for an electric vehicle which has been completed in an assembly line (not shown in the figure) and, more specifically, an inspection for a cell-to-cell connection anomaly inside a pack case of the battery pack. The inspection device includes: a charging unit 2 connected to a commercial power supply (such as 200-V three-phase alternating current power supply) through a power cable 8; and an inspection unit 3 arranged between the charging unit 2 and the battery pack 1. The inspection unit 3 has: a charging line 4 connected to a charging terminal of the battery pack 1 through a charging cable; and a signal line 5 connected to a signal terminal of the battery pack 1 through a signal cable with a connector. The signal terminal is connected to a battery controller (not shown) inside the battery pack 1 and, in a state that the battery pack is mounted to the vehicle, is connected to an in-vehicle network connector for communication with a controller of the vehicle. The battery controller is configured to perform voltage monitoring and charge/discharge control of individual cells. Since the battery controller is connected to the inspection unit 3 through the signal line 5, the battery controller sends e.g. the voltage data of the respective cells to the inspection unit 3 according to a request from the inspection unit 3. Similarly, the inspection unit 3 and the charging unit 2 are connected to each other through a charging line 6 and a signal line 7 so that the battery pack 1 can be charged by the charging unit 2 under the control of the inspection unit 3.

Figure 2:
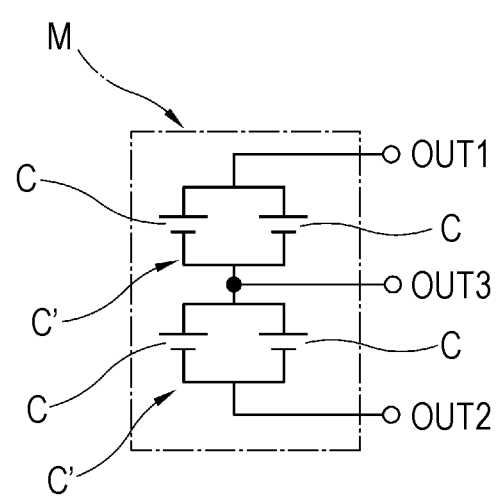
FIG. 2 is a circuit diagram of one module M of the battery pack.

The battery pack 1 uses, as cells (secondary batteries), lithium-ion batteries packaged in laminate films in one embodiment. More specifically, the battery pack 1 has a plurality of modules (in the present embodiment, forty-eight modules) accommodated in the pack case. Each one of the modules has four cells accommodated in a flat box-shaped module case. FIG. 2 shows a circuit configuration of one module M. In one module M, two cell groups C', in each of which two cells C are connected in parallel to each other, are connected in series to each other. Each module M includes positive and negative output terminals OUT1 and OUT2 and an intermediate output terminal OUT3 connected to an intermediate connection point between the cell groups.

Each of these three output terminals OUT1 to OUT3 is provided as e.g. a screw-type terminal on a side surface of the module case. In the module M, terminals (so-called electrode tabs) of the respective cells C are connected together by e.g. laser welding so as to form a circuit as shown in FIG. 2.

The plurality of modules M, e.g., forty-eight modules M in the pack case is connected via busbars such that all of the modules M are in series connection. In other words, the output terminal OUT1 of one of the modules M is successively connected to the output terminal OUT2 of another adjacent one of the modules M via the busbar. The potentials of the three output terminals OUT1 to OUT3 including the intermediate output terminal OUT3 are simultaneously inputted into the battery controller so that the battery controller monitors the respective voltages (cell voltages) of the ninety-six cell groups C.

Figure 3:
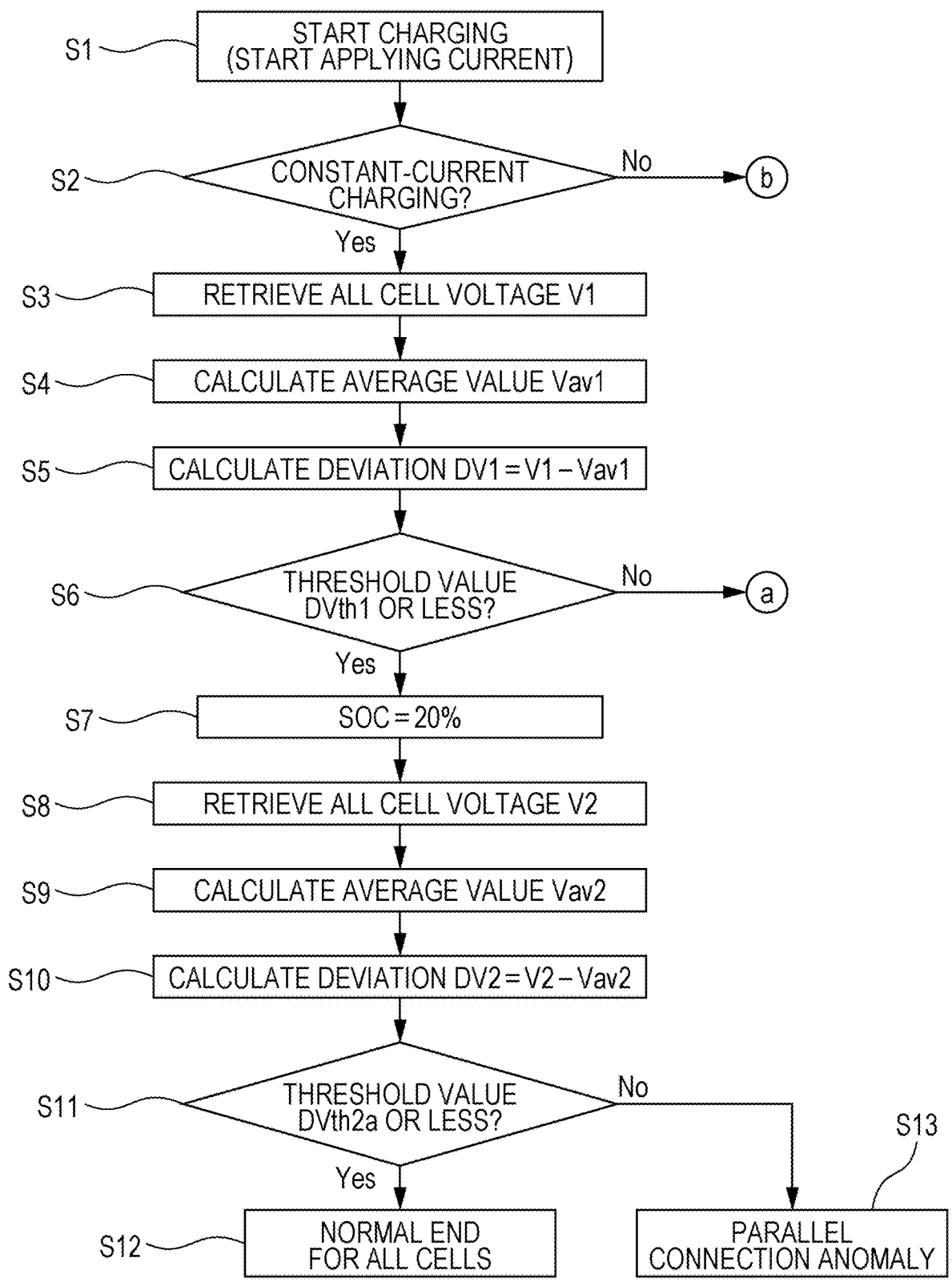
FIG. 3 is a flowchart for an inspection program executed by the inspection unit according to the one embodiment of the present invention.
Figure 4:
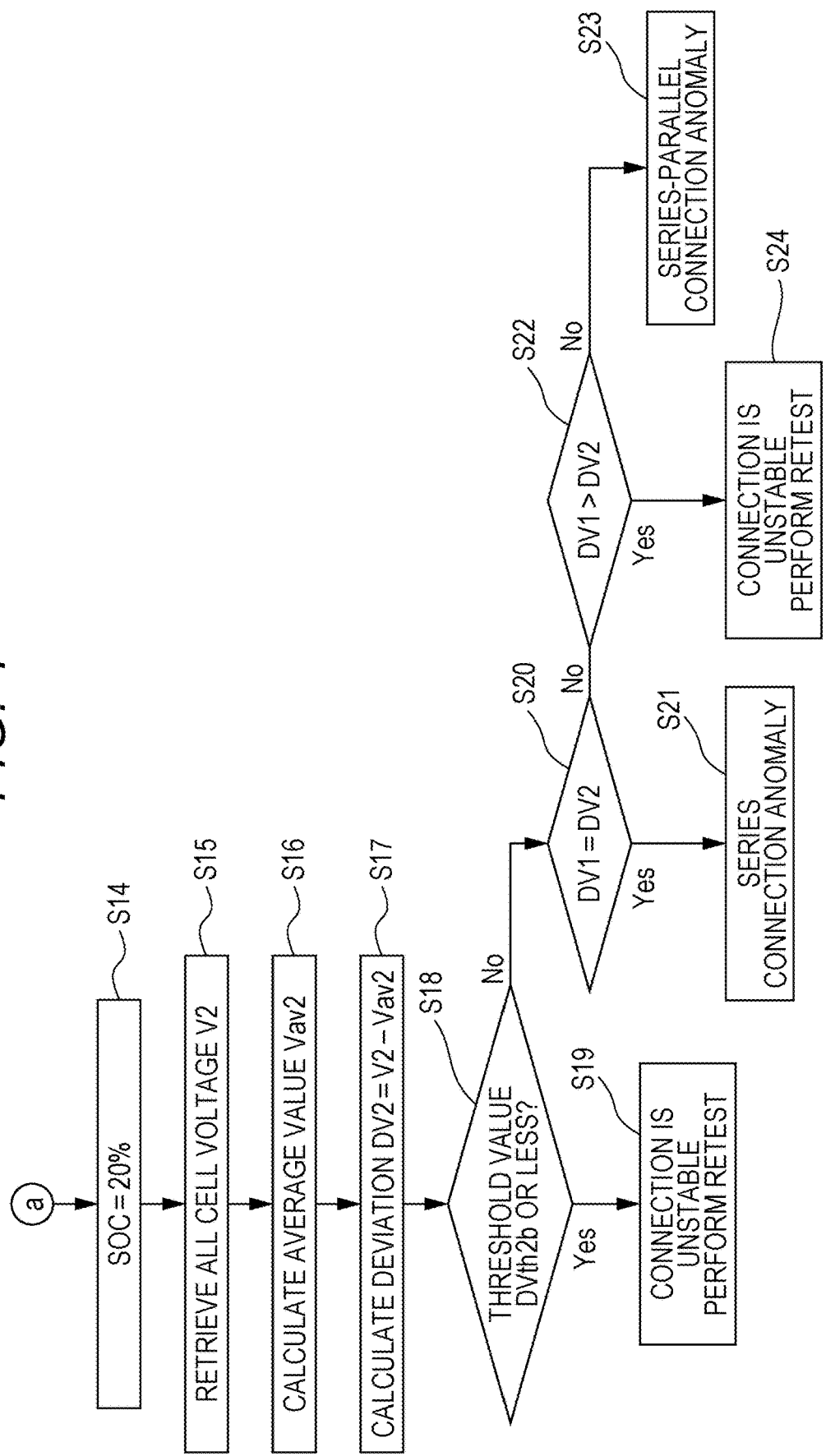
FIG. 4 is a flowchart following FIG. 3.

Next, an inspection program executed by the inspection unit 3 according to the flowcharts of FIGS. 3 to 5 will be explained below.

For inspection of the battery pack 1, the inspection unit 3 first outputs a charging start signal to cause the charging unit 2 to start charging of the battery pack 1 in step 1.

The cells C used in the battery pack 1 have already been inspected by various inspection tests during the manufacturing process of the respective cells C, and thus have been subjected to initial charging and to charging/discharging for test purposes. The SOC (state-of-charge) is adjusted to a constant level near the empty, e.g., adjusted to 5% at the completion of assembly of the battery pack 1.

In step 2, the inspection unit judges whether or not the current charging is constant-current charging. When the current charging is constant-current charging, the inspection unit proceeds to the processing of step 3 onward. When the current charging is not constant-current charging, the inspection unit proceeds to the processing of step 25 onward. The charging of the battery pack 1 by the charging unit 2 is basically started from constant-current charging. When the SOC reaches a certain level near the full charge, the charging current of the battery pack 1 is controlled to a current value according to the SOC. In the present embodiment, the inspection is performed under the constant-current charging.

In step 3, the inspection unit retrieves from the battery controller the voltage values of the respective cell groups C' immediately after the start of the charging, that is, at the charging start stage. The voltage value of the cell group C' at the early charging start stage is herein referred to as a "first cell voltage". Since the ninety-six cell groups C' are present in the present embodiment, data of ninety-six first cell voltages V1 is retrieved. In step 4, the inspection unit determines an average value Vav1 of the ninety-six first cell voltages V1. In step 5, the inspection unit determines a first cell voltage deviation DV1 of each cell group C' as a difference between the first cell voltage V1 of the cell group C' and the average value Vav1. In other words, the deviation values DV1 of all of the cell groups C' are determined according to the expression: DV1=V1−Vav1.

In step 6, the inspection unit judges whether the deviation DV1 is smaller than or equal to a predetermined threshold value DVth1. In one embodiment, the threshold value DVth1 is set to e.g. 0.18 V. The processing of step 6 is performed on all of the cell groups C'.

In step 7 or step 14, the inspection unit continues the constant-current charging until the SOC reaches a certain charge level. This charge level is set to a relatively low value e.g. a SOC value of 20%. As a matter of course, the SOC value is required to be within the range that the constant-current charging is continued. It is feasible to wait for the lapse of a certain charge time in place of checking the SOC value. The charge time is set in advance corresponding to a time required to reach a SOC of 20%.

At the state where the charging has proceeded to a certain level as mentioned above, the inspection unit retrieves from the battery controller the voltage values of the respective cell groups C' in step 8 or step 15. The voltage value of the cell group C' at such a charging proceeding stage is herein referred to as a "second cell voltage". Since the ninety-six cell groups C are present in the present embodiment, data of ninety-six second cell voltages V2 is retrieved. In step 9 or step 16, the inspection unit determines an average value Vav2 of the ninety-six second cell voltages V2.

In step 10 or step 17, the inspection unit determines a second cell voltage deviation DV2 of each cell group C' as a difference between the second cell voltage V2 of the cell group C' and the average value Vav2. In other words, the deviation DV2 is determined according to the expression: DV2=V2−Vav2.

In step 10, it is feasible to determine the deviation values DV2 of all of the cell groups C' or determine the deviation value DV2 of only any of the cell groups C' where the deviation DV1 of the first cell voltage V1 is judged as smaller than or equal to the threshold value DVth1 in step 6. Similarly, it is feasible in step 17 to determine the deviation values DV2 of all of the cell groups C' or determine the deviation value DV2 of only any of the cell groups C' where the deviation DV1 of the first cell voltage V1 is judged as greater than the threshold value DVth1 in step 6.

In step 11, the inspection unit judges whether the deviation DV2 of the cell group C' where the deviation DV1 of the first cell voltage V1 is judged as smaller than or equal to the threshold value DVth1 in step 6 is smaller than or equal to a predetermined threshold value DVth2a. In one embodiment, the threshold value DVth2a is set to the same value as the threshold value DVth1 in step 6, that is, set to e.g., 0.18 V. Basically, the threshold value DVth2a is the same as or approximate to the threshold value DVth1.

The judgment in step 11 is performed for all the cell groups C' for which the deviation DV1 of the first cell voltage V1 is smaller than or equal to the threshold value DVth1 in step 6. Then, the inspection unit proceeds to step 12 when the deviation DV2 is smaller than or equal to the threshold value DVth2a in all of the cell groups C'. The inspection unit judges that all of the cells C are in normal connection state, and then, the inspection unit exits from the inspection routine.

In step 11, when the deviation DV2 of any of the cell groups C' is larger than the threshold value DVth2a, the process proceeds to step 13, and the inspection unit judges that the cell group C' has a parallel connection anomaly. That is, when there is a cell group C' in which the deviation DV1 of the first cell voltage V1 is smaller than or equal to the threshold value DVth1 and the deviation DV2 of the second cell voltage V2 is larger than the threshold value DVth2a, the inspection unit judges that the cell group C' has a parallel connection anomaly. The parallel connection anomaly corresponds to a state in which one of the cells C is separated from a circuit due to peeling of a weld, for example, in the cell group C' in which a pair of cells C is connected in parallel as shown in FIG. 2.

On the other hand, in step 18, the inspection unit judges that the deviation DV2 of the cell group C' in which the deviation DV1 of the first cell voltage V1 is larger than the threshold value DVth1 in step 6 is smaller than or equal to a predetermined threshold value DVth2b of the cell group C'. In one embodiment, the threshold value DVth2b is the same as the threshold value DVth2a in step 11 and the threshold value DVth1 in step 6, and is, for example, 0.18 V. As the threshold value DVth2b, a value that is basically the same as or approximate to the threshold value DVth1 and the threshold value DVth2a can be used.

The judgement in step 18 is performed for all of the cell groups C' in which the deviation DV1 of the first cell voltage V1 is larger than the threshold value DVth1 in step 6. When the deviation DV2 of any of the cell groups C' is smaller than or equal to the threshold value DVth2b, the process proceeds to step 19, and the inspection unit judges that the connection of the cell group C' is unstable, and the retest is performed. That is, when there is a cell group C' in which the deviation DV1 of the first cell voltage V1 is larger than the threshold value DVth1 and the deviation DV2 of the second cell voltage V2 is smaller than or equal to the threshold value DVth2b, there is high possibility that any error has occurred or the state of the connection of a terminal or the like has changed due to vibration or the like, so that the retest is performed. In other words, the final diagnosis is suspended.

When the deviation DV2 of any of the cell groups C' is larger than the threshold value DVth2b in step 18, the two deviations DV1 and DV2 are compared in size in step 20 and step 22. When the two deviations DV1 and DV2 are equal to each other, the process proceeds from step 20 to step 21, and it is judged that the cell group C' has a series connection anomaly. That is, when the deviation DV1 of the first cell voltage V1 and the deviation DV2 of the second cell voltage V2 are larger than the threshold value DVth1 and the threshold value DVth2b, respectively, and the two deviations DV1 and DV2 are equal to each other, it is judged that the cell group C' has a series connection anomaly. The series connection anomaly refers to, in the series circuit as shown in FIG. 2, for example, looseness of a terminal in a connection portion between a busbar and a terminal connecting two adjacent modules M, biting of foreign matter at the connection portion, or a poor connection at a terminal weld between two cell groups C' in one module M. Here, the expression that the deviations DV1 and DV2 are equal to each other includes an appropriate certain range. For example, when the deviation DV2 is within the range of "DV1 ±α" (α is an appropriate minute amount), the both are assumed to be equal to each other.

When the deviation DV2 is larger than the deviation DV1, the process proceeds from step 22 to step 23, and it is judged that the cell group C' has both the series connection anomaly and the parallel connection anomaly. That is, this corresponds to a case where the deviation DV1 at the early stage of start of the charging is large and the deviation DV1 increases with the progress of charging.

Conversely, when the deviation DV1 is larger than the deviation DV2, the process proceeds from step 22 to step 24, and it is judged that the connection of the cell group C' is unstable, and the retest is performed. That is, this means that the deviation DV1 at the early stage of start of the charging is large and the deviation DV1 is reduced with the progress of charging, and there is high possibility that any error has occurred or the state of the connection of a terminal or the like has changed due to vibration or the like, so that the retest is performed. In other words, the final diagnosis is suspended.

Figure 5:
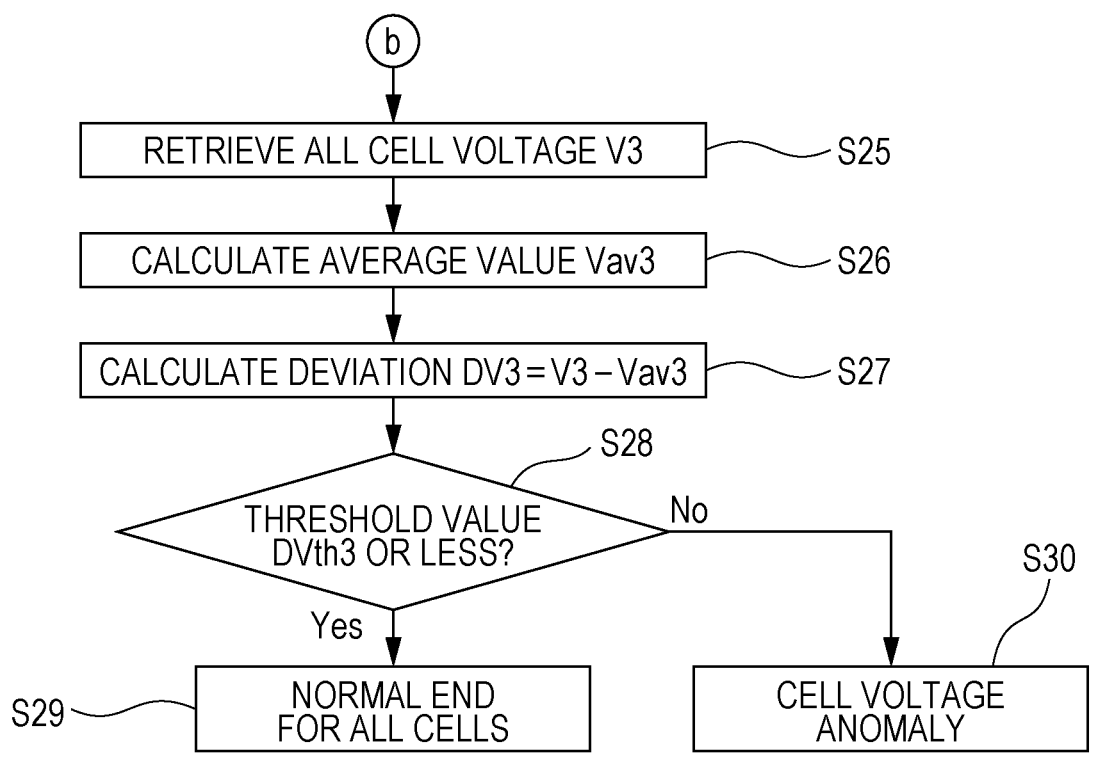
FIG. 5 is a flowchart following FIG. 3.

Steps 25 to 30 in FIG. 5 show preliminary processing when it is judged in step 2 that the charging is not constant-current charging. As described above, at the time of inspection using this inspection device, control is basically made to constant-current charging. In addition, the configuration may be such that no processing is not performed when the charging is not constant-current charging.

In step 25, as in step 3, the voltage of each cell group C' being charged (this is referred to as a third cell voltage V3) is retrieved from the battery controller. Since ninety-six cell groups C' are present in the present embodiment, data of ninety-six third cell voltages V3 is retrieved. In step 26, the average value Vav3 of the ninety-six third cell voltages V3 is calculated. Then, in step 27, for each cell group C', a deviation DV3 of the third cell voltage V3 as the difference between the third cell voltage V3 of the cell group C' and the average value Vav3 is determined. In other words, the deviations DV3 are determined for all of the cell groups C' according to the expression: DV3=V3−Vav3.

In step 28, the inspection unit judges whether the deviation DV3 is smaller than or equal to a predetermined threshold value DVth3. In one embodiment, the threshold value DVth3 is the same as the threshold value DVth1, and is, for example, 0.18 V. The process of step 28 is performed for all of the cell groups C'.

When the deviations DV3 of all of the cell groups C' are smaller than or equal to the threshold value DVth3, the process proceeds to step 29, and the inspection unit judges that the connection states of all the cells C' are normal, and exits from the inspection routine. When the deviation DV3 of any of the cell groups C' is larger than the threshold value DVth3, the process proceeds to step 30, and it is judged that the cell group C' has an abnormal cell voltage although the cause cannot be specified.

Figure 6:
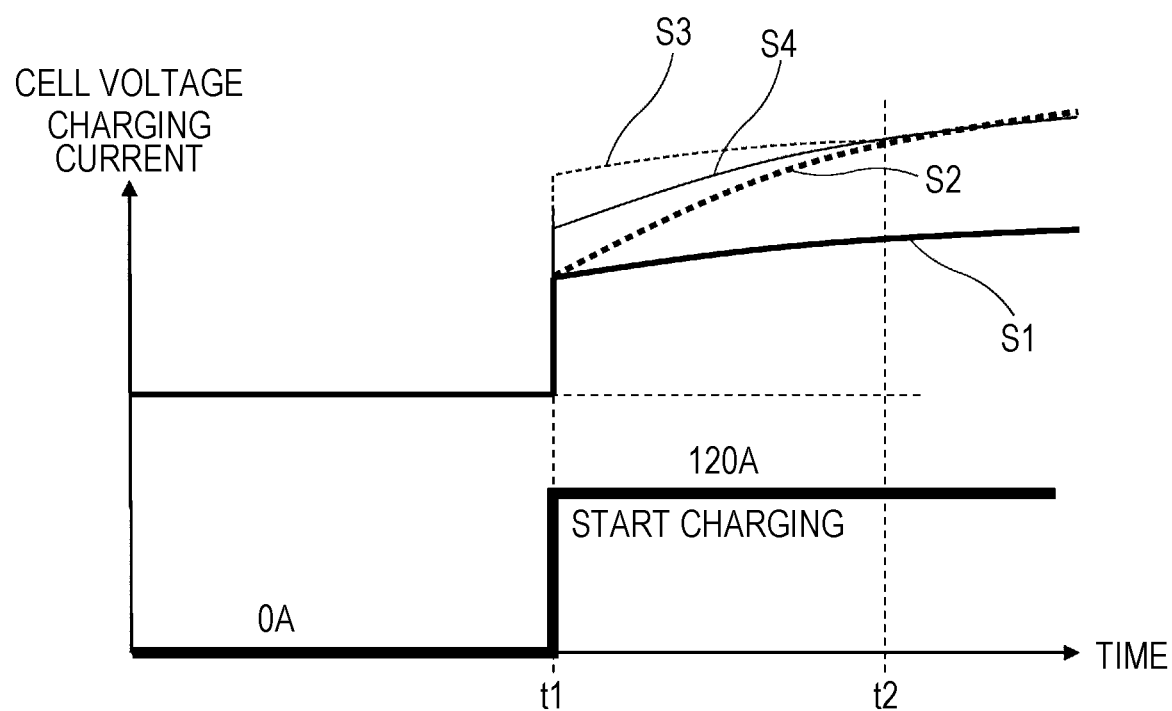
FIG. 6 is a characteristic diagram showing characteristics of cell voltage during constant-current charging of the battery pack.

FIG. 6 shows a charging current and a cell voltage (a voltage between output terminals at both ends of one cell group C') when the battery pack 1 is charged.

At time t1, charging by the charging unit 2 is started. Then, the cell voltage (that is, the first cell voltage V1) immediately after the start of charging, that is, at the early stage of start of the charging, is retrieved. The charging is performed with a constant-current (for example, 120 A) as shown. Then, at a time t2 when the SOC reaches, for example, 20%, the cell voltage (that is, the second cell voltage V2) is retrieved.

When the inside of the module M and the connection between the modules M are normal, the cell voltage of each cell group C' changes as shown by the line S1. That is, it rises stepwise with the start of charging, and then rises gradually with the progress of charging. As described above, at the time of the start of charging, the SOC of each cell C is equal to about 5%.

Compared to such a normal characteristic (S1), in the parallel connection anomaly, that is, when one cell C in the cell group C' is separated from the circuit, the electrode area of the cell group C' is changed to half the other cell groups C', so that the voltage rise due to charging is more rapid. That is, as shown by the line S2, the characteristic shows that the cell voltage (first cell voltage V1) at the early stage of start of the charging is not much different from that of the normal cell group C', and, with the progress of the charging, the voltage is higher than the cell voltage of the normal cell group C'. This characteristic (S2) corresponds to step 13 in the flowchart of FIG. 3 described above.

Further, in the series connection anomaly, that is, in a state of looseness of the terminal at a portion connected in series, biting of foreign matter, locally increased resistance due to poor welding, or the like, the cell voltage during charging of the cell group C' including the resistor is higher due to the presence of the resistor. Since the charging is performed by a constant-current charging, the amount of voltage rise due to the presence of the resistor is basically constant. Therefore, as shown by the line S3, the voltage is higher than the cell voltage of the normal cell group C' from the early stage of start of the charging, and gradually rises with the progress of charging as in the normal cell group C'. In other words, the line of the characteristic (S3) at the time of the series connection anomaly is substantially parallel to that of the normal characteristic (S1). This characteristic (S3) corresponds to step 21 in the flowchart of FIG. 4 described above.

When both the series connection and the parallel connection are abnormal, the cell voltage (first cell voltage V1) at the early stage of start of the charging is higher than the cell voltage of the normal cell group C' as shown by the line S4, for example. In addition, the voltage rise with the progress of charging is more rapid than the voltage rise of the normal cell group C'. This characteristic (S4) corresponds to step 23 in the flowchart of FIG. 4 described above.

When one cell group C' or one cell C constituting the cell group C' is short-circuited, the cell voltage of the cell group C' becomes lower than that of the normal cell group C', and the deviation DV1 of the first cell voltage V1 and the deviation DV2 of the second cell voltage V2 both have relatively large negative values. Therefore, in the flowcharts of FIGS. 3 to 5, the process finally proceeds to step 21 and it is diagnosed as the series connection anomaly. By judging whether the deviations DV1 and DV2 are positive or negative, the short circuit of the cell C can be further distinguished from another aspect of the series connection anomaly.

As described above, according to the inspection device or the inspection method of the above embodiment, while performing the constant-current charging after the completion of the battery pack 1, it is possible to detect the connection anomaly between the modules M, the connection anomaly inside the module M, and the like, so that the quality of the battery pack 1 shipped as a product can be further improved. In addition, the module M and the cell group C' having the anomaly can be easily identified, and the type of the anomaly (parallel connection anomaly, series connection anomaly, and both anomaly) can be distinguished, so that the response after the anomaly is detected is easy. For example, the series connection anomaly can be often resolved by retightening the screw-type terminal of the module M connected to the busbar. In addition, the parallel connection anomaly inside the module M can be promptly handled by replacing the module M.

Although the above embodiment refers to the inspection of the battery pack under the constant-current charging, the present invention can alternatively be embodied to perform the inspection of the battery pack under constant-current discharging.

Figure 7:
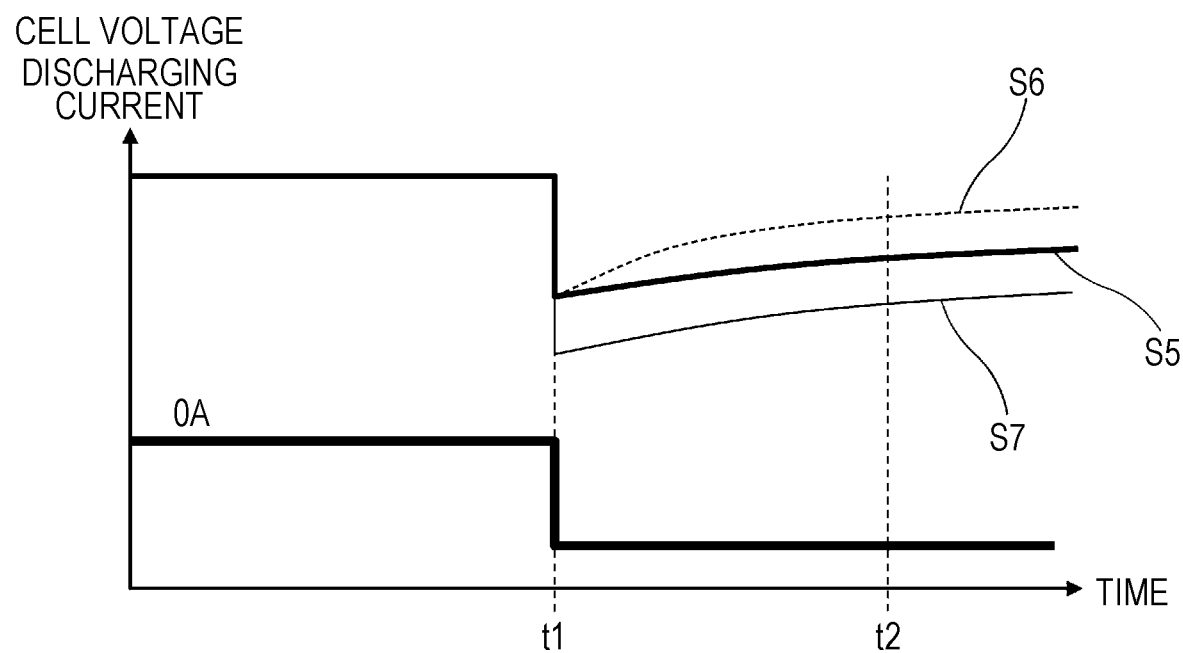
FIG. 7 is a characteristic diagram showing characteristics of cell voltage during constant-current discharging of the battery pack.

FIG. 7 shows characteristics of the cell voltage during the constant-current discharging. When the discharging is started at time t1, the voltage of the normal cell group C' decreases stepwisely at the start of the discharging and then increases gently as indicated by line S5.

By contrast, the characteristic of the cell voltage in which a parallel connection anomaly is present increases rapidly as indicated by line S6 as compared to the characteristic (S5) of the normal cell group C'.

As indicated by line S7, the characteristic of the cell voltage in which a series connection anomaly is present becomes lower by an amount of the resistance in the cell group C' than the characteristic (S5) of the normal cell group C'.

It is accordingly possible to identify the cell group C' in which the connection anomaly is present and the kind of the connection anomaly by retrieving the cell voltage at the early stage of start of the discharging (as a first cell voltage V1) and the cell voltage at time t2 where the discharging proceeds to a predetermined SOC level (as a second cell voltage V2) and comparing each of these retrieved cell voltages with the average value of the cell voltages of all of the cell groups C'.

The inspection of the battery pack 1 according to the present invention can be performed even in a state that the battery pack 1 is mounted to the vehicle.

Although one cell group is constituted by parallel connection of two cells C in the above embodiment, the present invention is also applicable to the case where three or more cells C are connected in parallel. Furthermore, it is alternatively feasible to use the average value of the cell voltages of appropriate some of the cell groups C' although the average value of the cell voltages of all of the cell groups C' is used in the above embodiment.

The invention claimed is:

1. An inspection method of a battery pack, the battery pack comprising a plurality of cell groups connected in series, each of the cell groups comprising a plurality of chargeable/dischargeable cells connected in parallel, the inspection method comprising:
charging the battery pack at a constant current;
retrieving voltages of the respective cell groups at an early stage of start of the charging as first cell voltages;
retrieving voltages of the respective cell groups at a stage where the charging proceeds to a predetermined level as second cell voltages;
comparing the first cell voltage of each of the cell groups with an average value of the first cell voltages of the cell groups, thereby determining a first deviation value;
comparing the second cell voltage of each of the cell groups with an average value of the second cell voltages of the cell groups, thereby determining a second deviation value; and
judging, based on the first and second deviation values, any one of the cell groups as a group cell having a series connection anomaly when (a) the first and second deviation values of the cell group are greater than predetermined values and (b) the first and second deviation values of the cell group are equal in level.

2. The inspection method of the battery pack according to claim 1, further comprising:
judging, based on the first and second deviation values, any one of the cell groups as a cell group having a series-parallel connection anomaly when (a) the first and second deviation values of the cell group are greater than the predetermined values and (b) the second deviation value of the cell group is greater than the first deviation value of the cell group.

3. The inspection method according to claim 1, wherein the battery pack is used in an electric car.

4. The inspection method according to claim 1, wherein the battery pack further comprises a pack case.

5. The inspection method of the battery pack according to claim 1, further comprising:
judging, based on the first and second deviation values, any one of the cell groups as a group cell having a parallel connection anomaly when (a) the first deviation value of the cell group is smaller than or equal to the predetermined value and (b) the second deviation value of the cell group is greater than the predetermined value.

6. The inspection method of the battery pack according to claim 5, further comprising:
judging based on the first and second deviation values, any one of the cell groups as a cell group having a series-parallel connection anomaly when (a) the first and second deviation values of the cell group are greater than the predetermined values and (b) the second deviation value of the cell group is greater than the first deviation value of the cell group.

7. The inspection method of the battery pack according to claim 1,
wherein an average value of the cell voltages of all of the series-connected cell groups is determined as the average value of the first cell voltages or the average value of the second cell voltages.

8. The inspection method of the battery pack according to claim 7, further comprising:
judging based on the first and second deviation values, any one of the cell groups as a cell group having a series-parallel connection anomaly when (a) the first and second deviation values of the cell group are greater than the predetermined values and (b) the second deviation value of the cell group is greater than the first deviation value of the cell group.

9. The inspection method of the battery pack according to claim 7, further comprising:
judging, based on the first and second deviation values, any one of the cell groups as a group cell having a parallel connection anomaly when (a) the first deviation value of the cell group is smaller than or equal to the predetermined value and (b) the second deviation value of the cell group is greater than the predetermined value.

10. An inspection device of a battery pack, the battery pack comprising a plurality of cell groups connected in series, each of the cell groups comprising a plurality of chargeable/dischargeable cells connected in parallel, the battery pack further comprising a battery controller built therein to monitor voltages of the respective cell groups, the inspection device comprising:
an inspection unit connected to the cells of the battery pack through a charging line and connected to the battery controller of the battery pack through a signal line; and
a charging unit connected to a commercial power supply and configured to charge the battery pack at a constant current through the inspection unit,
wherein the inspection unit is configured to:
cause the charging unit to perform charging of the battery pack at a constant current;
retrieve, from the battery controller, voltages of the respective cell groups at an early stage of start of the charging as first cell voltages;
retrieve, from the battery controller, voltages of the respective cell groups at a stage where the charging proceeds to a predetermined level as second cell voltages;
determine a first deviation value by comparing each of the first cell voltages of the cell groups with an average value of the first cell voltages of the cell groups;
determine a second deviation value by comparing each of the second cell voltages of the cell groups with an average value of the second cell voltages of the cell groups; and
judge, based on the first and second deviation values, any one of the cell groups as a group cell having a series connection anomaly when (a) the first and second deviation values of the cell group are greater than predetermined values and (b) the first and second deviation values of the cell group are equal in level.

11. The inspection device of the battery pack according to claim 10, wherein the inspection unit is configured to judge, based on the first and second deviation values, any one of the cell groups as a group cell having a parallel connection anomaly when (a) the first deviation value of the cell group is smaller than or equal to the predetermined value and (b) the second deviation value of the cell group is greater than the predetermined value.

12. The inspection device according to claim 10, wherein the battery pack is used in an electric car.

13. The inspection device according to claim 10, wherein the battery pack further comprises a pack case.

14. The inspection device of according to claim 10, wherein an average value of the cell voltages of all of the series-connected cell groups is determined as the average value of the first cell voltages or the average value of the second cell voltages.

\* \* \* \* \*